United States Patent [19]

Hayashi et al.

[11] Patent Number: 4,864,585
[45] Date of Patent: Sep. 5, 1989

[54] EXTERNAL CAVITY TYPE SEMICONDUCTOR LASER APPARATUS

[75] Inventors: Hiroshi Hayashi, Kyoto; Shigeki Maei; Osamu Yamamoto, both of Nara; Hidenori Kawanishi, Higashiosaka; Nobuyuki Miyauchi, Tenri, all of Japan

[73] Assignee: Sharp Kabushiki Kaisha, Osaka, Japan

[21] Appl. No.: 169,685

[22] Filed: Mar. 18, 1988

[30] Foreign Application Priority Data

Mar. 19, 1987 [JP] Japan .................... 62-64586

[51] Int. Cl.$^4$ ............ H01S 3/08; H01S 3/18; H01S 3/04; H01L 23/02
[52] U.S. Cl. ......................... 372/92; 372/43; 372/36; 372/93; 372/99; 357/81
[58] Field of Search ............ 372/43, 50, 92, 93, 372/94, 99, 34, 36; 357/81

[56] References Cited

U.S. PATENT DOCUMENTS 4,352,120 9/1982 Kurihara et al. ............ 357/81

FOREIGN PATENT DOCUMENTS 3410729 9/1985 Fed. Rep. of Germany ........ 372/43
0111391 7/1983 Japan ............................ 372/92

OTHER PUBLICATIONS

Patent Abstracts of Japan (Jul. 3, 1981) 5(103), E-64, 775.
Patent Abstracts of Japan (Sep. 28, 1983) 7(218), E-200, 1363.
Andrews, (1985) Applied Physics Letters 47(2):71–73.
Yamamoto et al., (1987) Journal of Applied Physics 61(3):870–874.
Patent Abstracts of Japan (Mar. 9, 1984), 8(53), E-231, 1490.

Primary Examiner—William L. Sikes
Assistant Examiner—Georgia Y. Epps
Attorney, Agent, or Firm—Irell & Manella

[57] ABSTRACT

An external cavity type semiconductor laser apparatus comprising a semiconductor laser device and an external reflector, which are mounted on a single mounting base with a distance therebetween, wherein laser light from the light-emitting rear facet of the laser device is reflected by the reflector and returns to the laser device, the coefficient of linear expansion of the mounting base being smaller than that of Cu and being greater than those of both the laser device and the reflector.

2 Claims, 6 Drawing Sheets

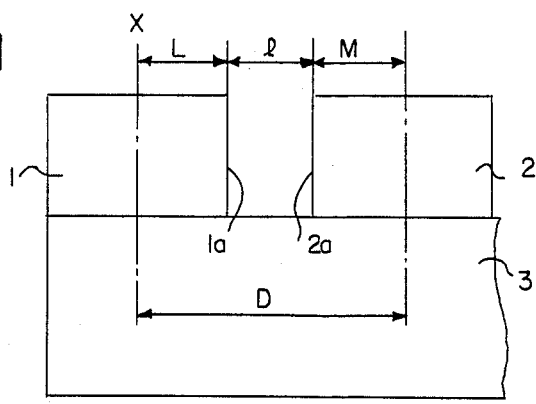
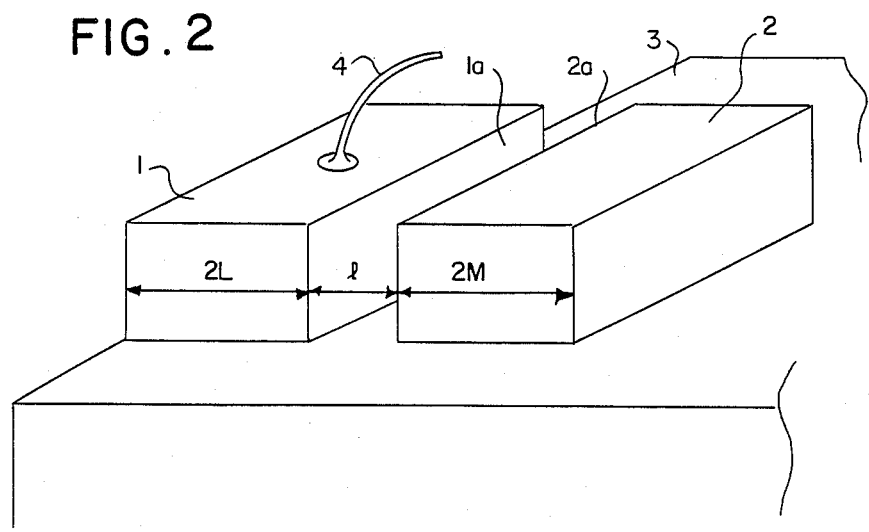

EXTERNAL CAVITY TYPE SEMICONDUCTOR LASER APPARATUS

BACKGROUND OF THE INVENTION

1. Field of the Invention

This invention relates to an external cavity type semiconductor laser apparatus in which light from the light-emitting rear facet of a semiconductor laser device is reflected by an external reflector and returns to the said semiconductor laser device.

2. Description of the Prior Art

Conventional semiconductor laser devices have been designed so that the oscillation longitudinal mode of the laser devices can be selected depending upon the gain distribution of laser media and the transmission characteristics of the laser resonator. FIGS. 6(a) to 6(c) show the selectivity of the oscillation longitudinal mode of a conventional semiconductor laser device, wherein FIG. 6(a) shows the relationship between the wavelength and the gain distribution of laser media, FIG. 6(b) shows the relationship between the wavelength and the spectrum of each longitudinal mode, and FIG. 6(c) shows the spectrum in the superradiant situation that is obtained by the superposition of the characteristic curves of FIGS. 6(a) and 6(b). In general, of the longitudinal modes of laser light produced by a semiconductor laser device, a longitudinal mode of laser light with a wavelength that is the closest to the peak (the maximum value) of a gain distribution receives the greatest gain and becomes an oscillation longitudinal mode. However, the bandgap of the semiconductor materials of the laser device varies with changes in ambient temperature, and accordingly the wavelength peak of the gain distribution is shifted to the longer wavelength side at the rate of 2-3 Å/deg. Moreover, not only the refractive index of laser media varies, but the laser cavity length varies with changes in the thermal expansion of the laser device, so that the said longitudinal modes are shifted to the longer wavelength side at the rate of about 0.7 Å/deg., while maintaining a longitudinal mode spacing of about 3 Å therebetween. Thus, when ambient temperature rises, since the amount of change in the gain distribution is greater than that of change in the longitudinal modes at the beginning, the oscillation wavelength continuously varies over a period of time. When the temperature further rises, the oscillation wavelength brings about mode hopping, after which the oscillation wavelength causes the above process to repeat itself resulting in continuous changes and further mode hopping, as shown in FIG. 8, thereby attaining a step function type change. Moreover, the wavelength also varies with changes in current for driving the laser device. The above-mentioned phenomena prevent the application of conventional semiconductor laser devices as a light source for either wavelength multiplex optical-communication or a high resolution spectrometer.

In order to solve these problems, an SEC laser apparatus (short external cavity laser diode) has been invented in which laser light from the light-emitting rear facet of a semiconductor laser device is reflected by an external reflector and returns to the said semiconductor laser device. The oscillation longitudinal mode of the said laser device of the SEC laser apparatus is selected depending upon three factors, namely, the gain distribution of the laser, the longitudinal modes, and the selectivity of wavelength of the external cavity, which are shown in FIGS. 7(a), 7(b) and 7(d) in contradistinction to those of FIGS. 6(a) to 6(c). FIG. 7(a) shows the relationship between the wavelength and the gain distribution of laser media, FIG. 7(b) shows the relationship between the wavelength and the spectrum of each longitudinal mode, FIG. 7(c) shows the relationship between the wavelength and the resonance characteristics of the external cavity, and FIG. 7(d) shows the spectrum in the superradiant situation that is obtained by the superposition of the characteristic curves of FIGS. 7(a) to 7(c). The envelope curve of the spectrum in the superradiant situation of FIG. 7(d) is of a ripple, whereas that of the spectrum in the superradiant situation of FIG. 6(c) is of a smooth circular arch. The temperature characteristics of the peak of the envelope curve can be controlled by changes in the external cavity length (i.e., the distance between the semiconductor laser device and the external reflector), thereby attaining the suppression of mode hopping.

The characteristics of an oscillation wavelength with respect to temperatures of an ordinary SEC laser apparatus are shown in FIGS. 9(a) to 9(c), indicating that the same longitudinal mode is maintained in a temperature range of $\Delta t$; that a longitudinal mode successively receives the greatest gain in the same peak of the envelope curve of the spectrum shown in FIG. 7(d) in a temperature range of $\Delta T$ and becomes an oscillation longitudinal mode; and that when the temperature range exceeds $\Delta T$, the oscillation longitudinal mode is shifted to the adjacent peak of the envelope curve, resulting in significant and sudden change of the oscillation longitudinal wavelength (i.e., mode hopping).

Moreover, FIG. 9(a) indicates that the temperature coefficient of the wavelength of the peak of the envelope curve shown in FIG. 7(d), $d\bar{\lambda}/dT$, and the temperature coefficient of the longitudinal modes shown in FIG. 7(b), $\gamma$, have the following relationships: when $d\bar{\lambda}/dT<\gamma$, the oscillation longitudinal mode is successively shifted to a longitudinal mode that is positioned at the short wavelength side and a small mode hopping in a temperature range of $\Delta T$ results. FIG. 9(b) indicates that when $d\bar{\lambda}/dT=\gamma$, the value of $\Delta T$ becomes equal to $\Delta t$, and the mode hopping does not occur in the range of $\Delta T$. FIG. 9(c) indicates that when $d\bar{\lambda}/dT>\gamma$, the oscillation longitudinal mode is successively shifted to a longitudinal mode that is adjacent to the long wavelength side, resulting in a small mode hopping in the range of $\Delta T$.

The above-mentioned SEC laser apparatus is composed of a VSIS (V-channelled Substrate Inner Stripe) double-heterostructure semiconductor laser device with an active layer of, for example, AlGaAs grown on a GaAs substrate, and an external reflector made of a GaAs chip the cleaved facets of which are coated with dielectric films so as to have a high reflectivity. Both the semiconductor laser device and the external reflector are mounted on a single mounting base of Cu with a space (i.e., the external cavity length) between the light-emitting rear facet of the said laser device and the reflecting face of the said external reflector. The reason why Cu is used for the mounting base is that the heat conductivity of Cu is so great that the semiconductor laser device can achieve an excellent heat-radiation. However, Cu has a great thermal expansion coefficient.

With an SEC laser apparatus that is composed of a semiconductor laser device with a length of 250 $\mu$m and an external reflector with a length of 250 $\mu$m, which are mounted on such a Cu mounting base, when the length of the external cavity is 60 μm, it is possible that $d\bar{\lambda}/dT$ (i.e., the temperature coefficient of the wavelength of the peak of the envelope curve shown in FIG. 7(d)) agrees with the temperature coefficient (0.7 Å/°C.) of the longitudinal mode of laser, and accordingly, as shown in FIG. 9(b), no mode-hopping occurs in the range of ΔT and a specific lasing mode can be maintained, wherein ΔT is 28° C.

However, it is difficult in practice to control the temperature (at both ends of arrow mark shown in FIG. 9(b)) at which great mode hopping occurs. Accordingly, in the case where a specific temperature range in which mode hopping does not occur must be selected, the yield of laser devices decreases and/or a large amount of time is needed for the selection of characteristics. In order to solve these problems, it is necessary to enlarge the temperature range ΔT in which mode hopping does not occur and to heighten the probability that a specific temperature range falls within the value of ΔT.

SUMMARY OF THE INVENTION

The external cavity type semiconductor laser apparatus of this invention, which overcomes the above-discussed and numerous other disadvantages and deficiencies of the prior art, comprises a semiconductor laser device and an external reflector, which are mounted on a single mounting base with a distance therebetween, wherein laser light from the light-emitting rear facet of said laser device is reflected by said reflector and returns to said laser device, the coefficient of linear expansion of said mounting base being smaller than that of Cu and being greater than those of both said laser device and said reflector.

In a preferred embodiment, the mounting base is made of Fe or a metal alloy that consists mainly of Fe.

Thus, the invention described herein makes possible the objective of providing an external cavity type semiconductor laser apparatus in which mode hopping of the lasing mode can be suppressed over a wide range of temperatures, resulting in stabilized operation characteristics.

BRIEF DESCRIPTION OF THE DRAWINGS

This invention may be better understood and its numerous objects and advantages will become apparent to those skilled in the art by reference to the accompanying drawings as follows:

FIG. 1 is a schematic diagram showing the fundamental principle of this invention.

FIG. 2 is a perspective view showing a semiconductor laser apparatus of this invention.

DESCRIPTION OF THE PREFERRED EMBODIMENTS

Figure 3A:
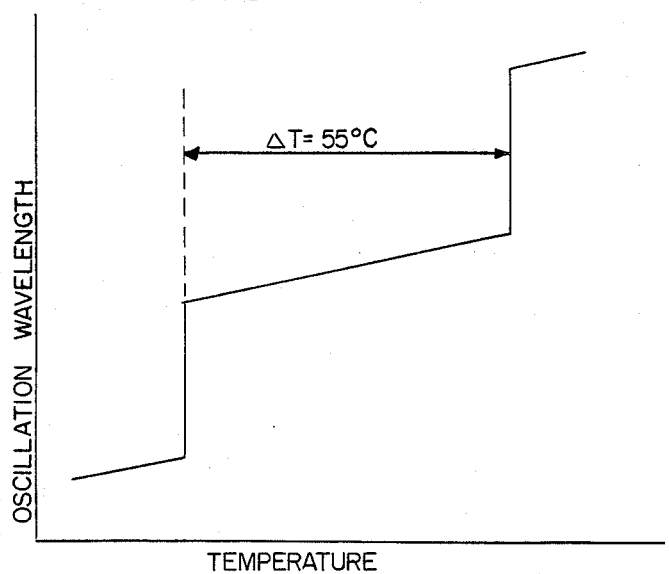
FIG. 3(a) is of a characteristic curve showing the relationship between the temperature and the oscillation wavelength of the semiconductor laser apparatus of FIG. 2.

This invention provides a semiconductor laser apparatus with an improved external cavity structure by which the above-mentioned temperature span ΔT can be enlarged.

FIG. 1 shows an external cavity type semiconductor laser apparatus of this invention that is composed of a semiconductor laser device 1 and an external reflector 2, both of which are mounted on a single mounting base 3 with a distance (external cavity length) l between the light-emitting rear facet 1a of the semiconductor laser device 1 and the reflecting face 2a of the external reflector 2. Laser light from the light-emitting rear facet 1a of the semiconductor laser device 1 is reflected by the reflecting face 2a of the external reflector 2 and returns to the semiconductor laser device 1. The reference label L is the half value of the cavity length of the semiconductor laser device 1, the reference label M is the half value of the length of the reflector 2, and the reference label D is the distance between the thermal expansion center X of the semiconductor laser device 1 and the thermal expansion center Y of the reflector 2. According to this invention, materials having a coefficient of linear expansion, which is smaller than that of Cu but is greater than those of both the semiconductor laser device and the external reflector, are used as a mounting base material so that the enlargement of ΔT can be attained.

Figure 9A:
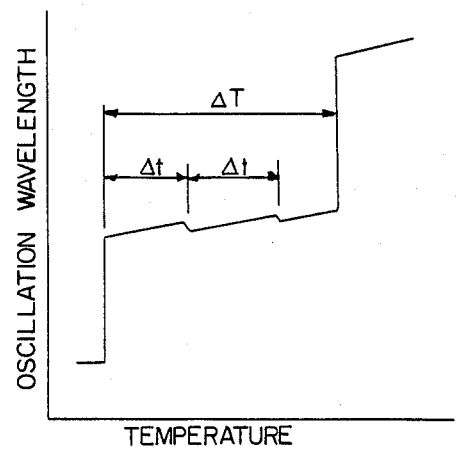
FIGS. 9(a) to 9(c) are of characteristic curves showing the relationship between the temperature and the oscillation wavelength of an ordinary SEC semiconductor laser apparatus.
Figure 9B:
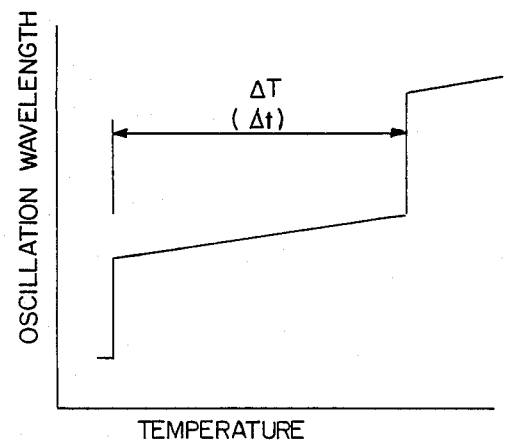

The behavior of longitudinal oscillation modes of an external cavity type semiconductor laser apparatus depends upon the following three factors, one of which is the gain distribution of a laser device used in the said apparatus, another is a longitudinal mode of the laser device, and the third is the selectivity of an oscillation wavelength by an external cavity used in the said apparatus. As mentioned in Description of Prior Art, with regard to changes in longitudinal oscillation modes due to temperatures, when a laser device is designed considering the dependence of these three factors on temperatures, the laser device can be provided with excellent characteristics that bring about no mode hopping over a temperature gain of ΔT as shown in FIG. 9(b).

Figure 7A:
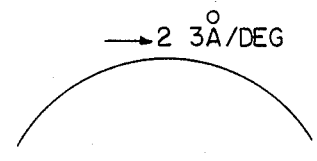
FIGS. 7(a) to 7(d) are of characteristic curves showing the selectivity of the oscillation longitudinal mode of a SEC semiconductor laser apparatus of this invention.
Figure 7B:
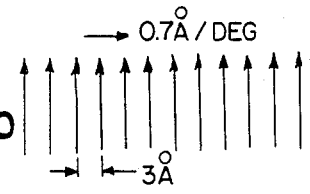
Figure 7C:
Figure 6C:
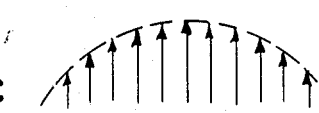
Figure 7D:
Figure 8:
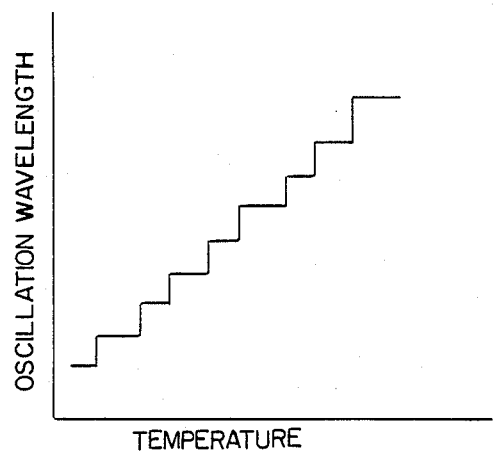
FIG. 8 is of a characteristic curve showing the relationship between the temperature and the oscillation wavelength of a conventional semiconductor laser device.
Figure 9C:
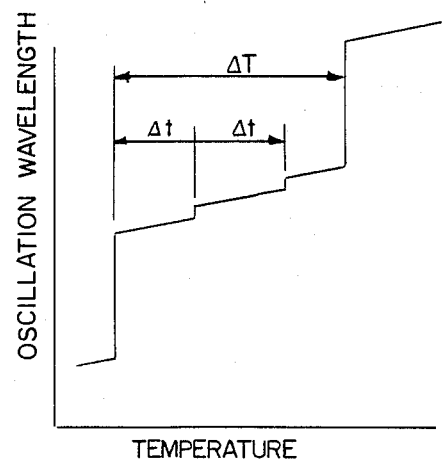

In order to further enlarge the temperature span ΔT, it is effective that the external cavity length l is set to be small so as to enlarge the resonance spacing in the resonance characteristics of the external cavity shown in FIG. 7(c). However, when the value of l alone is set to be small without changing other conditions, the rate of changes in resonance peak wavelengths λe due to temperatures T, dλe/dT, of the external cavity increases, resulting in a mode hopping to the longer wavelength mode in a range of ΔT as shown in FIG. 9(c).

Since the semiconductor laser apparatus of this invention is constructed so that a semiconductor laser device and an external reflector are mounted on a single mounting base having a coefficient of linear expansion that is smaller than that of Cu, the rate of change in the external cavity length due to temperature decreases, and accordingly to the rate of change in the external mode (i.e., the resonance peak wavelength of the external cavity) due to temperature also decreases, thereby attaining the enlargement of a temperature range in which the oscillation wavelength can be stabilized (that is, mode hopping does not occur). More detailed explanation in this respect is as follows:

The dependence of the external mode Δe on the temperature T has a relation with the thermal expansion of the external cavity. The rate of changes in the external mode due to temperatures is generally represented by equation (1):

$$\frac{d\lambda e}{dT} = \frac{\lambda_0}{l} \cdot \frac{dl}{dT} \quad (1)$$

wherein l is the length of an external cavity with a resonance wavelength $\lambda_0$.

The rate of change in the external mode due to temperature, dΔe/dT, decreases with a decrease in the thermal expansion coefficient of the external cavity.

In the semiconductor laser apparatus, the amount of change in the external cavity length l due to temperature is the syntheses of the thermal deformations of the semiconductor laser device 1, the reflector 2 and the mounting base 3. The semiconductor laser device 1 and the reflector 2, which are fixed to the mounting base 3 by a soldering substance, are thermally deformed around the centers (X and Y) thereof, respectively. Accordingly, when the changes in the external cavity length l due to temperature occur, the thermal deformation of the mounting base arises in the region with a length D between the thermal expansion center X of the semiconductor laser device 1 and the thermal expansion center Y of the reflector 2. The external cavity length l is represented by equation (2):

$$l = D - (L + M) \quad (2)$$

When the coefficients of linear expansion of the semiconductor laser device 1, the reflector 2 and the mounting base 3 are $\alpha_1$, $\alpha_2$ and $\alpha_3$, respectively, the rate of change in l due to temperature is represented by equation (3):

$$\begin{aligned} dl/dT &= \alpha_3 D - (\alpha_1 L + \alpha_2 M) \\ &= \alpha_3 l + (\alpha_3 - \alpha_1)L + (\alpha_3 - \alpha_2)M \end{aligned} \quad (3)$$

Thus, the rate of change in the external mode due to temperature can be given from equation (1) by equation (4):

$$\frac{d\lambda e}{dT} = \lambda_0 \left\{ \alpha_3 + \frac{L}{l}(\alpha_3 - \alpha_1) + \frac{M}{l}(\alpha_3 - \alpha_2) \right\} \quad (4)$$

Given that the semiconductor laser device 1 and the reflector 2 are made of the same material (that is, $\alpha_1 = \alpha_2 = \alpha$), equation (4) can be represented by equation (4'):

$$\frac{d\lambda e}{dT} = \lambda_0 \left\{ \alpha_3 + \frac{L + M}{l}(\alpha_3 - \alpha) \right\} \quad (4')$$

Further, given that the mounting base 3 is made of the same material as both the semiconductor laser device 1 and the reflector 2 (that is, $\alpha_1 = \alpha_2 = \alpha_3 = \alpha$), equation (4) can be represented by equation (4''):

$$\frac{d\lambda e}{dT} = \lambda_0 \alpha \quad (4'')$$

Therefore, the rate of changes in the external mode due to temperature, dλe/dT, is independent of the external cavity length. The equation (4) indicates that dλe/dT decreases with a decrease in $\alpha_3$.

Figure 4:
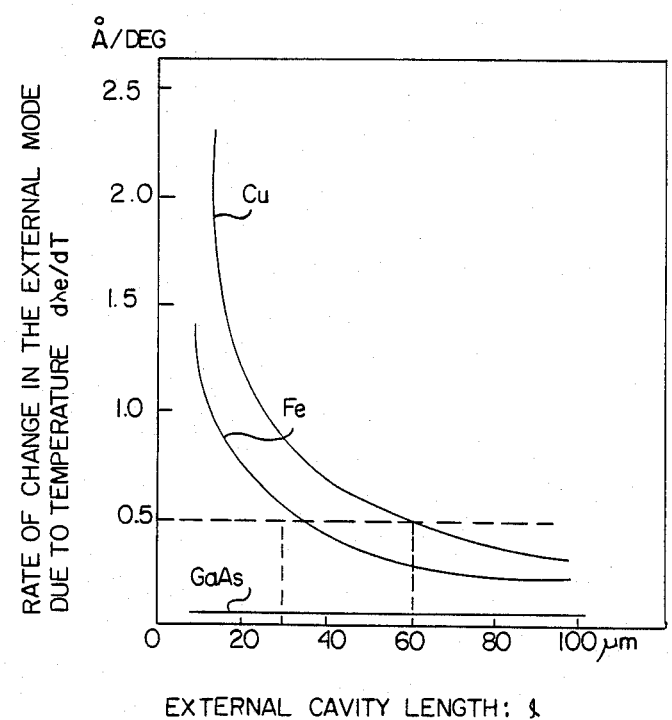
FIG. 4 is of characteristic curves showing the relationship between the external cavity length and the rate of changes in the external mode due to temperatures in the case where the kinds of mounting base materials are set to be a parameter with regard to a semiconductor laser apparatus of this invention.

FIG. 4 shows the rate of change in the external mode due to temperature in the case where Cu, Fe and GaAs are used as a mounting base material in an external cavity type semiconductor laser apparatus composed of a semiconductor laser device with a GaAs substrate and an external reflector made of a GaAs chip, wherein the coefficients of linear expansion of Cu, Fe and GaAs, α(Cu), α(Fe) and α(GaAs), are $1.7 \times 10^{-5}$/deg., $1.18 \times 10^{-5}$/deg., and $5.9 \times 10^{-6}$/deg., respectively. It can be seen from FIG. 4 that even if the external cavity length l is set at a fixed value, dλe/dT decreases when a material having a small coefficient of linear expansion is used for the mounting base. It can also be seen that when the coefficient of linear expansion of the mounting base material is small, the external cavity length l can be made small while dλe/dT is being maintained at a fixed level. The experimental optimum value of dλe/dT that has been obtained is 0.5 Å/°C. The external cavity length l that corresponds to the said value of dλe/dT is 60 μm when the mounting base material is Cu and as short as 28 μm when the mounting base material is Fe.

Figure 5:
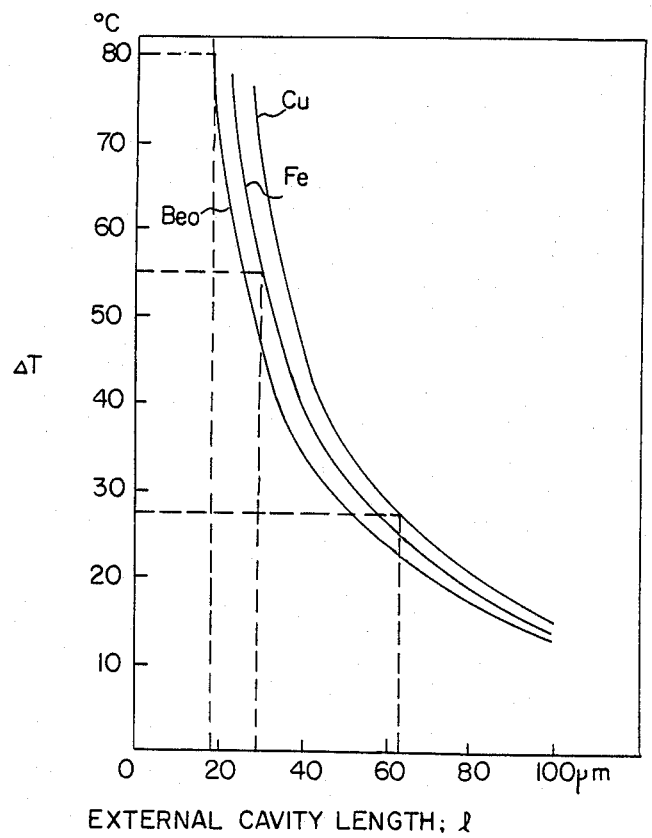
FIG. 5 is of characteristic curves showing the relationship between the external cavity length and ΔT in the case where the kinds of mounting base materials are set to be a parameter with regard to a semiconductor laser apparatus of this invention.
Figure 6A:
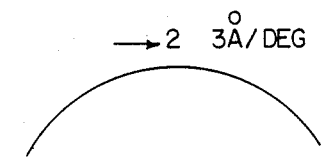
FIGS. 6(a) to 6(c) are of characteristic curves showing the selectivity of the oscillation longitudinal mode of a conventional semiconductor laser device.
Figure 6B:
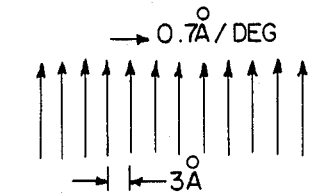

FIG. 5 shows the dependence of ΔT (see FIG. 9) on the external cavity length l based on the calculated data in the case where Cu, Fe and GaAs, respectively, are used for the mounting base material. The value of ΔT under the above-mentioned optimum condition is enlarged, 60° C. (l=28 μm) when Fe is used for the mounting base, whereas it is 28° C. (l=60 μm) when Cu is used for the mounting base.

As mentioned above, when the material having a small coefficient of linear expansion is used for the mounting base, the optimum external cavity length can be set to be small and the temperature span ΔT can be enlarged.

However, in the case where the coefficient of linear expansion of the mounting base is smaller than those of the semiconductor laser device and the reflector, the value of dλe/dT becomes around zero or a negative value so that the determination of the optimum conditions of the external cavity structure becomes difficult.

EXAMPLE 1

FIG. 2 shows an external cavity type semiconductor laser apparatus of this invention that is composed of a VSIS semiconductor laser device 1 with an AlGaAs active layer grown on a GaAs substrate and an external reflector 2 of GaAs. The reflecting face 2a of the reflector 2 that faces the light-emitting rear facet 1a of the semiconductor laser device 1 has a dielectric film thereon so as to attain a high reflectivity of about 95%. Both the semiconductor laser device 1 and the GaAs chip 2 are mounted on a mounting base (i.e., a heat-sink) 3 made of Fe or a metal alloy that consists mainly of Fe. A lead wire 4 of Al is connected to the semiconductor laser device 1. The reference label 2L is the cavity length of the semiconductor laser device 1, the reference label 2M is the length of the reflector 2, and the reference label l is the distance (i.e., the external cavity length) between the light-emitting rear facet 1a of the laser device 1 and the reflecting face 2a of the reflector 2.

An external cavity type semiconductor laser apparatus with the above-mentioned structure was constructed so that a VSIS semiconductor laser device with a cavity length 2L of 250 μm and a GaAs chip (the reflectivity of the reflecting face being 95%) with a length 2M of 250 μm are mounted on a Fe mounting base with a distance l of 30 μm therebetween. The dependence of the oscillation wavelength on temperatures of this external cavity type semiconductor laser apparatus was examined and the results are shown in FIG. 3(a), indicating that mode hopping does not occur over the temperature span ($\Delta T$) of 55° C. and a specific oscillation mode is maintained to thereby attain a stabilized oscillation. A remarkable improvement of the temperature span $\Delta T$ was attained as compared with the temperature span $\Delta T(28° C.)$ of an external cavity type semiconductor laser apparatus having a Cu mounting base with the same structure as mentioned above.

EXAMPLE 2

Figure 3B:
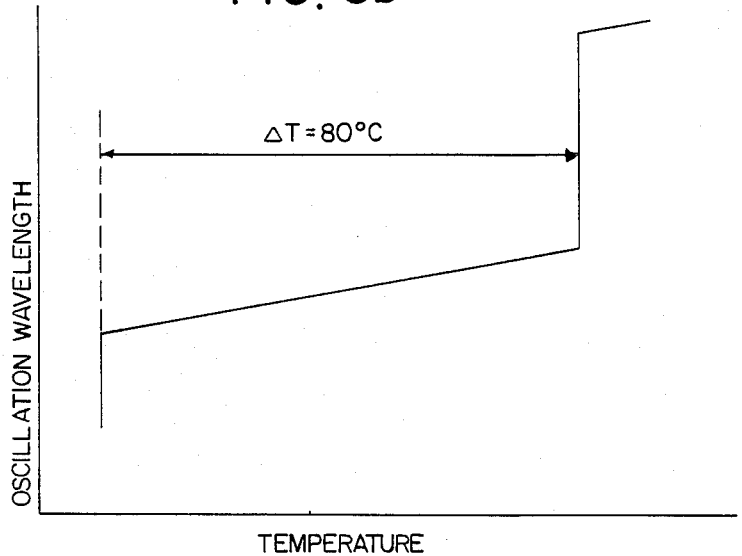
FIG. 3(b) is of a characteristic curve showing the relationship between the temperature and the oscillation wavelength of another semiconductor laser apparatus of this invention.

FIG. 3(b) shows another external cavity type semiconductor laser apparatus of this invention in which BeO (the coefficient of linear expansion thereof being $7.6 \times 10^{-6}/\deg.$) was used for the mounting base and the external cavity length l was 15 μm. In this example, the dependence of the oscillation wavelength on temperature was further improved and mode hopping did not occur over a wide range of temperatures $\Delta T$ that is as wide as 80° C.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An external cavity type semiconductor laser apparatus comprising a semiconductor laser device and an external reflector, which are mounted on a single mounting base with a distance therebetween, laser light from the light-emitting rear facet of said laser device being reflected by said reflector and returning to said laser device, wherein the coefficient of linear expansion of said mounting base is smaller than that of Cu and is greater than those of both said laser device and said reflector, whereby the rate of change in the external cavity length of said external cavity type semiconductor laser apparatus due to temperature decreases, and accordingly the rate of change in the resonance peak wavelength of the external cavity due to temperature also decreases, thereby attaining the enlargement of a temperature range in which mode hopping does not occur.

2. An external cavity type semiconductor laser apparatus according to claim 1, wherein said mounting base is made of Fe or a metal alloy that consists mainly of Fe.

* * * * *